United States Patent Office 3,609,959
Patented Oct. 5, 1971

3,609,959

ELECTRONIC WATCH

Jakob Luscher, Carouge, Geneva, Switzerland, assignor to Societe Suisse pour l'Industrie Horlogere S.A., Geneva, Switzerland Filed Aug. 26, 1969, Ser. No. 853,025
Claims priority, application Switzerland, Aug. 26, 1968, 12,785/68
Int. Cl. G04c *3/00*
U.S. Cl. 58—23 6 Claims

ABSTRACT OF THE DISCLOSURE

An electronic watch with a timebase producing high frequency electrical pulses, an electronic scaler for this frequency, and a time-indicating device controlled by the electrical pulses of scaled frequency produced by the scaler. The scaler is an integrated circuit and comprises several scaler stages arranged in cascade. Those stages intended for scaling low frequency pulses each comprise, on the one hand, a first elementary voltage amplifier having an insulated gate field-effect transistor and adapted either to allow the pulses received from the preceding stage to pass to the following stage when the transistor is blocked, or to block said pulses when the said transistor is conductive. The control voltage of said transistor is the voltage across its input capacitance. The stages for sealing the low frequency pulses comprise, on the other hand, means for alternately charging and discharging said input capacitance with the frequency of the pulses to be scaled. The watch further comprises, for each scaler stage intended for the scaling of low frequency pulses, a device adapted to periodically recharge the input capacitance of the transistor of said amplifier, at a frequency higher than that of the pulses being scaled, to maintain the voltage across said capacitance at a level corresponding at least to the threshold voltage of said transistor despite the energy losses of said capacitance as a consequence of leakage currents. The aforesaid device comprises a periodic voltage source which delivers signals of frequency higher than that of the pulses being scaled. There is, further, a second elementary voltage amplifier having an insulated gate field-effect transistor, supplied from said source and connected with its input to the gate of the transistor of said first amplifier. Also provided are an electrical power source and an electronic switching circuit for periodically connecting said electrical power source to the gate of the transistor of said first amplifier which circuit is connected by its input to the output of said second amplifier. The arrangement is such as to provide recharging of said input capacitance by said electrical power source as long as the voltage across said capacitance is higher than the threshold voltage of the transistor of said second amplifier, at a frequency corresponding to that of the signals delivered by said periodic voltage source.

This invention relates to electronic watches.

It has already been proposed, in particular in U.S. Pat. No. 3,383,570, that, an elementary scaler, designed fundamentally for scaling medium frequency signals, might also be used as a divider for low frequency signals by connecting to it a compensating device designed to maintain the charge level in the memory capacitor of this kind of circuit at an adequate level for the exercise of its function, this despite the constant energy loss to which the capacitor is subject by reason of the leakage currents it develops.

This elementary circuit comprises an elementary voltage amplifier using a single transistor, the latter being of the field-effect kind with an insulated control electrode, and being designed to pass pulses received from the preceding scaler stage to the succeeding stage, in a chain of series-connected scaler stages, this when said transistor is blocked, or on the other hand to prevent the passage of said pulses when said transistor is conductive, the control voltage source for said transistor being constituted by its input capacitance which is alternatively charged up and discharged at the frequency of the scaled signal so that the amplifier transistor is alternately conductive and blocked at said same frequency, the input capacitance of the transistor thus constituting the stage memory.

As indicated, when this kind of circuit is used to scale relatively low frequency signals, the input capacitance of the transistor is discharged as a consequence of leakage currents to which it is subject prior to the arrival of that pulse of the signal being scaled which follows the one which produced the charge on said capacitor, and which pulse must in fact effect the complete discharge of the capacitance and be suppressed at the circuit output.

In the above eventuality the memory capacitance of the circuit being discharged on the arrival at said circuit of each pulse of the signal being scaled, the transistor of the amplifier is always blocked at said instant so that it allows all the pulses to pass. The scaling stage then does not fulfill its function and the time indicated by the electronic watch is consequently far from correct.

The invention seeks to overcome the above drawbacks and relates to an electronic watch comprising a timebase producing high frequency electrical pulses, an electronic scaler for this frequency, a time-indicating device controlled by the electrical pulses of scaled frequency produced by the scaler, said scaler having the form of an integrated circuit and comprising several scaler stages arranged in cascade, those stages intended for scaling low frequency pulses each comprising, on the one hand, a first elementary voltage amplifier having an insulated gate field-effect transistor and adapted either to allow the pulses received from the preceding stage to pass to the following stage when the transistor is blocked, or to block said pulses when the said transistor is conductive, the control voltage of said transistor being voltage across its input capacitance, and comprising, on the other hand, means for alternately charging and discharging said input capacitance, with the frequency of the pulses to be scaled, said watch further comprising, for each scaler stage intended for the scaling of low frequency pulses, a device adapted to periodically recharge the input capacitance of the transistor of said amplifier, at a frequency higher than that of the pulses being scaled, such as to maintain the voltage across said capacitance at a level corresponding at least to the threshold voltage of said transistor despite the energy losses of said capacitance as a consequence of leakage currents during the time separating the moment at which it is charged and the moment provided for its discharge under the control of said means, wherein said device comprises: a periodic voltage source which delivers signals of frequency higher than that of the pulses being scaled; a second elementary voltage amplifier having an insulated gate field-effect transistor, supplied from said source and connected with its input to the gate of the transistor of said first amplifier; an electrical power source; and an electronic switching circuit for periodically connecting said electrical power source to the gate of the transistor of said first amplifier, which circuit is connected by its input to the output of said second amplifier, the whole arrangement being such as to provide recharging of said input capacitance by said electrical power source as long as the voltage across said capacitance is higher than the threshold voltage of the transistor of said second amplifier, at a frequency corresponding to that of the signals delivered by said periodic voltage source.

Figure 1:
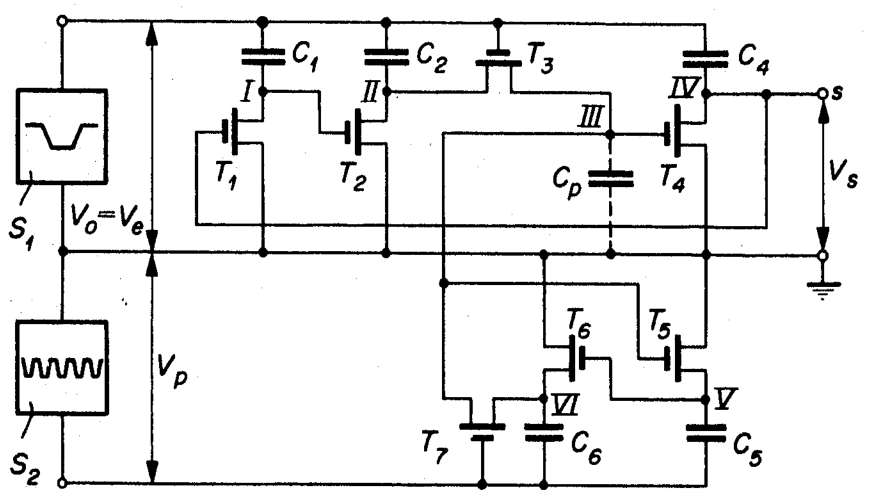
FIG. 1 is a schematic diagram of a scaler stage for handling periodic signals of medium frequency, for use in an electronic timepiece, complete with its compensating device to enable it also to scale low frequency signals.

The scaler stage illustrated in FIG. 1 is designed to effect division of low frequency signals and to form part of an electronic scaler in a timepiece of the type described in U.S. Pat. No. 3,383,570 previously referred to. It is made exclusively of an arrangement of voltage amplifiers having one field-effect transistor with an insulated control electrode, and voltage amplifiers with two transistors, as described in said patent. The same applies to the compensating device associated with this stage, whose precise mode of operation will be indicated hereinafter.

The one-transistor voltage amplifiers are those comprising the transistor $T_1$ and the capacitor $C_1$, the transistor $T_4$ and the capacitor $C_4$, the transistor $T_5$ and the capacitor $C_5$; the two-transistor amplifiers comprise, in one case, a transistor $T_2$, a capacitor $C_2$ and a transistor $T_3$, and on the other hand, a transistor $T_6$, a capacitor $C_6$ and a transistor $T_7$.

The input and output of the circuit $T_2$, $C_2$, $T_3$ are connected, respectively, to the output of the circuit $T_1$, $C_1$, and to the input of the circuit $T_4$, $C_4$, the output of the latter being connected to the input of circuit $T_1$, $C_1$. These three circuits are supplied from a source $S_1$ producing a periodic voltage $V_o$ in the form of trapezoidal waveform pulses, said voltage simultaneously constituting the input voltage $V_e$ whose frequency is to be scaled (stepped down).

In the scaler stage illustrated, which is designed for cascade, coupling with other similar or different stages, the source $S_1$ for each of these is constituted in practice by the scaler stage occupying the preceding position in the cascade.

The input of the circuit $T_5$, $C_5$ is connected to the control electrode of the transistor $T_4$ of the amplifier circuit $T_4$, $C_4$, and its output is connected to the input of circuit $T_6$, $C_6$, $T_7$. The latter circuit is connected at its output to the input of transistor $T_4$.

The two circuits $T_5$, $C_5$ and $T_6$, $C_6$, $T_7$ are supplied by a source $S_2$ producing a periodic voltage $V_p$ in the form of pulses of trapezoidal waveform at a frequency higher than that of the pulses from the source $S_1$, for example in the ratio 1000/1.

This source $S_2$ can be constituted by the timebase of the watch, by a preceding scaler stage producing a signal of sufficiently high frequency, or by a source of any kind which is totally independent of the ones indicated above.

The scaler illustrated in FIG. 1 is designed for manufacture in integrated circuit form, all the transistors being of MOS field-effect type with an insulated control electrode. The capacitors are also MOS capacitors.

It will next be recapitulated how the part of the scaler supplied by the source $S_1$, the alternating signal from which is to be scaled, operates when the frequency of said signal is a medium frequency.

It will be assumed, to this end, that at the time $t_1$ (FIG. 2), the capacitor $C_p$, constituted by the input capacitance of the transistor $T_4$, is charged up so that said transistor is able to pass current while the transistor $T_1$ is blocked.

Figure 2:
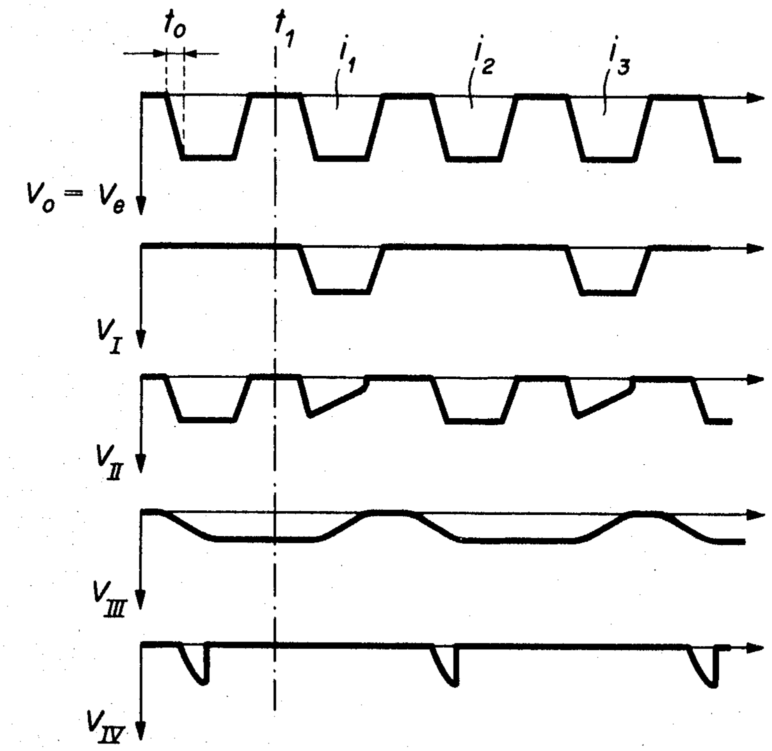
FIGS. 2 and 3 are explanatory diagrams.

The first pulse $i_1$ of voltage $V_o$ produced by the source $S_1$, after the instant $t_1$ (FIG. 2), will have the effect of driving the transistor $T_2$ into the conductive condition and discharging the capacitor $C_p$ across the transistors $T_2$ and $T_3$ (see the potential curve $V_{III}$ in FIG. 2). Since the mutual conductance of the transistor $T_2$ is selected to be small in relation to that of the transistor $T_4$, the discharge of the capacitor $C_p$ will take place in a longer time than the time of rise or decay $t_o$, of the flanks of the pulses $V_o$.

The result is that no voltage appears at the point IV so that no voltage $V_s$ appears at the output S of the scaler before the next pulse $i_2$ of voltage $V_o$. The latter will have the result of driving the transistor $T_1$ conductive, blocking the transistor $T_2$, causing a voltage to appear at point II and causing the capacitor $C_p$ to recharge. The slope of the transistor $T_3$ being made smaller than that of the transistor $T_4$, said recharging will take a time longer than $t_o$, and this will enable a pulse of the voltage $V_s$ to appear at the output $s$ (voltage $V_{IV}$ in the diagram of FIG. 2).

The result of the foregoing is that at the output $s$ of the circuit, a single pulse or voltage $V_s$ appears for each two pulses of voltage $V_o$ received from the source $S_1$, so that the frequency of said source has been divided by two.

The diagram of FIG. 2 illustrates the time function of the potential at the points I, II, III and IV of a scaler circuit of the kind constituted by the upper part of FIG. 1, and goes to show how important is the part played by the capacitor $C_p$ constituted by the input capacitance of the transistor $T_4$.

It will readily be appreciated that this capacitor does not on its own constitute the source of control voltage for the transistor $T_4$ but that it moreover does duty as the memory of the scaler which controls the blocking of the transistor $T_4$, this blocking function being the determining factor in the production of output pulses $V_s$ only once for each two received pulses $V_o$. This scaler stage thus constitutes a binary counter.

As described, the transistor $T_4$ only remains conductive if the control voltage supplied to it by the capacitor $C_p$ is higher than its threshold voltage. However, the capacitor $C_p$, like any other capacitor, loses its charge over a period of time as a consequence of leakage currents, and, in particular, since the capacitor at issue here is actually constituted by the input capacitance of the transistor $T_4$, the latter forming part of an integrated circuit, the major leakage cause is the reverse current across the junction.

This loss of electrical charge becomes very appreciable when the frequency of the signal being scaled is relatively low and the ambient temperature is high, since the reverse current across a junction increases exponentially with the absolute temperature. In this instance, in other words, the scaler constituted by the single upper part of the arrangement of FIG. 1, will not operate, as already mentioned.

Figure 3:
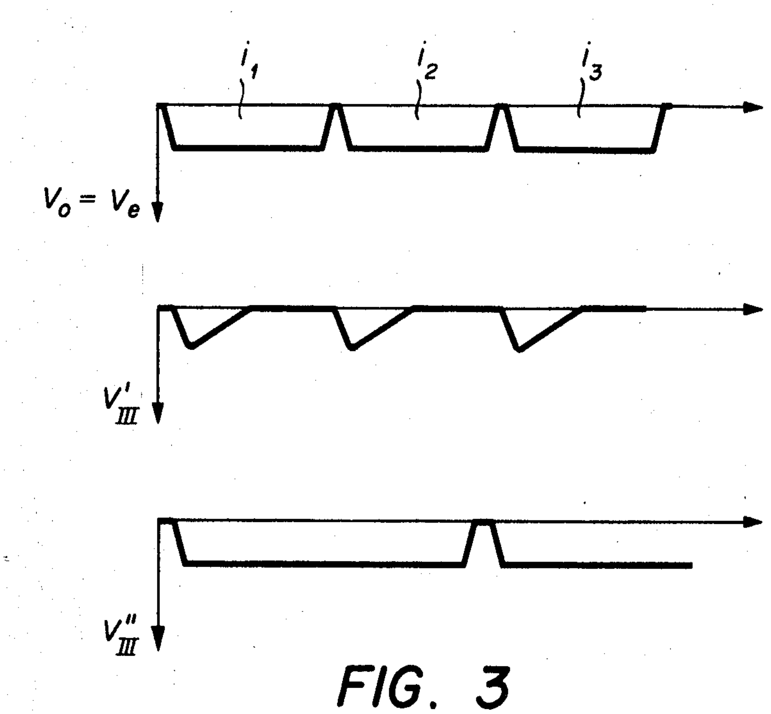

FIG. 3 illustrates how the state of the charge on the capacitor $C_p$ varies as a function of time (diagram $V'_{III}$) when the scaler stage of FIG. 1, provided fundamentally in order to scale a medium frequency signal, is used to scale a relatively low frequency signal of the order for example of some few cycles per second (diagram $V_o$).

In this case, it will be seen that the charge on the capacitor $C_p$ has fallen to zero even before the next pulse of voltage $V_o$ has arrived at the scaler, so that the transistor $T_4$ which was instantaneously driven conductive, has reverted to the blocked condition again by the time said pulse arrives:

The result is that the scaler stage produces a pulse in respect of each pulse it receives, and not one for each two.

In accordance with the invention, it is therefore arranged that the scaler whose operation has just been described, is complemented by the device illustrated by way of example in the bottom part of FIG. 1 and which is designed to provide permanent supply of energy to the capacitor $C_p$ during the whole of the time for which it should remain charged in order for operation of the scaler to be satisfactory. It goes without saying, of course, that this supply need only be continued as long as the level of the charge of the capacitor $C_p$ is above a predetermined value.

Two amplifiers, namely the single transistor amplifier $T_5$ and $O_5$, and the two-transistor amplifier $T_6$, $C_6$ and $T_7$, are connected in order to satisfy this condition:

Thus, the single-transistor amplifier $T_5$, $C_5$ is directly controlled by the voltage across the capacitor $C_p$, to which latter the input of the transistor $T_5$ is connected, and this transistor is only driven conductive if the voltage across the capacitor $C_p$ is higher than its threshold voltage, whereas it remains blocked otherwise. Thus, once the capacitor $C_p$ has been charged to a sufficient level, the control electrode of the transistor $T_6$ is earthed across the now conductive transistor $T_5$, and the transistor $T_6$ remains blocked. Whilst the voltage remains zero at point V, there appears at point VI a signal of frequency corresponding to that of the signal produced by the source $S_2$. The transistor $T_7$ becomes conductive with each pulse received from $S_2$ with the result that because of the signal appearing at the point VI, the capacitor $C_p$ is recharged periodically with each pulse from the source $S_2$.

In reality, the crest of the signals represented in diagram $V''_{III}$ in FIG. 3, reflecting the state of charge of the capacitor $C_p$, is of course not constituted by a straight line but by a fine-toothed band in which the "toothing" of the characteristic corresponds to the recharging frequency.

Where the said source $S_2$ is constituted by the timebase of the watch or if derived from its scaler system, the pulses of the two sources $S_1$ and $S_2$ will of course be synchronised.

This, however, cannot be the case if the source $S_2$ is absolutely independent:

In such eventuality, the operation of the device comprising the source $S_2$ as well as the one-transistor ($T_5$, $C_5$) amplifiers and two-transistor ($T_6$, $C_6$ and $T_7$) amplifiers is ensured provided that the pulses produced by the source $S_2$ have sufficiently long rise times in relation to the pulses supplying the main circuit (source $S_1$).

The compensating device illustrated in FIG. 1, however, is not the only one which could be used.

Figure 4:
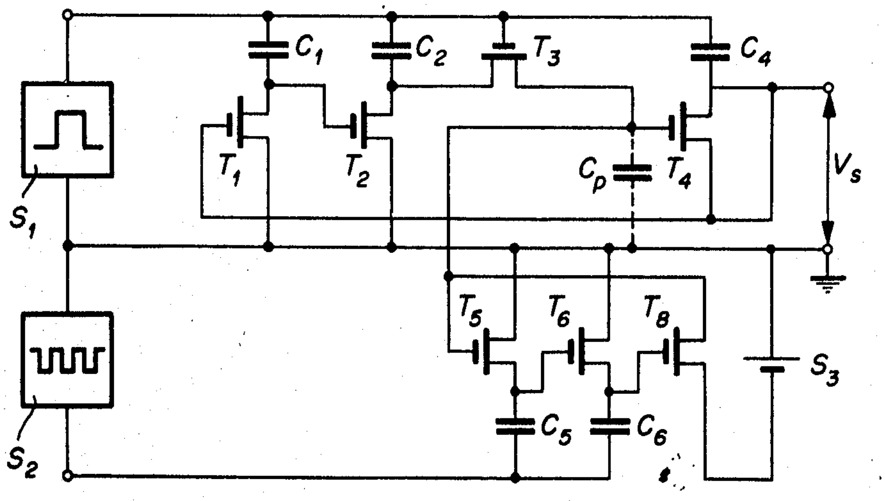
FIG. 4 illustrates a variant embodiment of the compensating device shown in FIG. 1.

FIG. 4 illustrates a variant embodiment of this device, associated with a scaler identical to that of FIG. 1.

In accordance with this variant, the electrical power designed for the periodic recharging of the input capacitance $C_p$ of the transistor $T_4$ is produced by a direct voltage source $S_3$ across the transistor $T_8$, each time said transistor is driven conductive.

Said transistor $T_8$ is in other words controlled by an elementary single-transistor amplifier $T_6$, $C_6$, whose input is connected across the output of another elementary single-transistor amplifier $T_5$, $C_5$, the input of which is connected to the control electrode of the transistor $T_4$, that is to say to the input capacitance of said transistor, being the capacitance upon which the device is to maintain the charge. The two elementary amplifiers $T_5$, $C_5$ and $T_6$, $C_6$ are supplied from a periodic voltage source $S_2$ of frequency higher than that of the source $S_1$ whose signal is to be scaled.

If the capacitance $C_p$ is totally discharged, that is to say if there is no voltage on the control electrode of the transistor $T_4$, then the transistor $T_5$ is blocked so that the transistor $T_6$ then becomes conductive, and hence the transistor $T_8$:

The source $S_3$ is cut off from the capacitor $C_p$ and supplies no charging current to it.

If, on the other hand, the voltage on the control electrode of the transistor $T_4$ is higher than the threshold voltage of the transistor $T_5$, that is to say that if the capacitor $C_p$ is at least partially charged, then said transistor $T_5$ goes conductive so that the transistor $T_6$ is blocked and the control electrode of the transistor $T_8$ is thus subjected to the variations in the periodic voltage produced by the source $S_2$.

This transistor alternately opens and closes at a frequency corresponding to that of the source $S_2$ so that the direct voltage source $S_3$ supplies its electrical energy to the capacitor $C_p$ with an identical frequency, and thus in pulse form.

I claim:

1. An electronic watch comprising a timebase producing high frequency electrical pulses, an electronic scaler for said frequency, a time-indicating device controlled by the electrical pulses of scaled frequency produced by the scaler, said scaler being an integrated circuit and comprising a plurality of scaler stages arranged in cascade, said plurality including stages adapted for scaling low frequency pulses, the latter said stages each comprising, on the one hand, a first elementary voltage amplifier including an insulated gate field-effect transistor and adapted either to allow pulses received from the preceding stage to pass to the following stage when the transistor is blocked, or to block said pulses when the said transistor is conductive, the transistor having a threshold voltage and an input capacitance, the control voltage of said transistor being the voltage across said capacitance, the latter said stages comprising, on the other hand, means for alternatively charging and discharging said input capacitance at the frequency of the pulses to be scaled, said watch further comprising, for each scaler stage adapted for scaling low frequency pulses, a device adapted to periodically recharge the input capacitance of the transistor of said amplifier, at a frequency higher than that of the pulses being scaled, to maintain the voltage across said capacitance at a level corresponding at least to the threshold voltage of said transistor despite energy losses of said capacitance as a consequence of leakage currents between when the capacitance is charged and when it is discharged under the control of said means, said device comprising a periodic voltage source which delivers signals of frequency higher than that of the pulses being scaled; a second elementary voltage amplifier including an insulated gate field-effect transistor, supplied from said source, and including an input connected to the gate of the transistor of said first amplifier and an output; an electrical power source; and an electronic switching circuit for periodically connecting said electrical power source to the gate of the transistor of said first amplifier, which circuit includes an input connected to the output of said second amplifier, the arrangement being such as to provide recharging of said input capacitance by said electrical power source as long as the voltage across said capacitance is higher than the threshold voltage of the transistor of said second amplifier, at a frequency corresponding to that of the signals delivered by said periodic voltage source.

2. A watch as claimed in claim 1, wherein the periodic voltage source of each said device is said timebase.

3. A watch as claimed in claim 1 wherein the periodic voltage source of the recharging device of each low frequency scaler stage consists of a preceding scaler stage in the cascade arrangement of the scaler.

4. A watch as claimed in claim 1 wherein the periodic voltage source of each said device is independent of the timebase.

5. A watch as claimed in claim 1 wherein the electrical power source is the said periodic voltage source and wherein said electronic switching circuit comprises an elementary voltage amplifier including two insulated gate field-effect transistors, the latter said amplifier including an output connected to the gate of the transistor of said first elementary amplifier and being supplied from said periodic voltage source.

6. A watch as claimed in claim 1 wherein the electrical power source is a direct current source and wherein said electronic switching circuit comprises, on the one hand, a third elementary voltage amplifier including an insulated gate field-effect transistor comprising an input connected to the output of said second amplifier and supplied from said periodic voltage source and comprises, on the other hand, an insulated gate field-effect transistor including a gate connected to the output of said third amplifier, a source connected to the said electrical power source, and a drain connected to the gate of the transistor of said first amplifier.

References Cited

FOREIGN PATENTS 791,946 8/1968 Canada ............... 58—23

RICHARD B. WILKINSON, Primary Examiner

E. C. SIMMONS, Assistant Examiner